United States Patent [19]

Taya et al.

[11] Patent Number: 4,634,931

[45] Date of Patent: Jan. 6, 1987

[54] ION IMPLANTER

[75] Inventors: Shunroku Taya, Mito; Susumu Kozasa, Kashiwa, both of Japan

[73] Assignee: Hitachi, Ltd., Tokyo, Japan

[21] Appl. No.: 636,996

[22] Filed: Aug. 2, 1984

[30] Foreign Application Priority Data

Aug. 10, 1983 [JP] Japan ................................ 58-146126

[51] Int. Cl.[4] .......................... H01J 7/24; H05B 31/26

[52] U.S. Cl. ........................ 315/111.81; 250/396 ML; 250/492.3; 430/323

[58] Field of Search ....................... 315/111.81, 111.91; 250/294, 298, 299, 396 ML, 492.2, 492.3; 430/322, 323

[56] References Cited

U.S. PATENT DOCUMENTS

| | | | |
|---|---|---|---|
| 3,500,042 | 3/1970 | Castaing et al. | 250/298 |
| 3,920,988 | 11/1975 | Taya et al. | 250/298 |
| 4,524,275 | 6/1985 | Cottrell et al. | 250/298 |

*Primary Examiner*—Saxfield Chatmon

*Attorney, Agent, or Firm*—Antonelli, Terry & Wands

[57] ABSTRACT

Ions emitted from an ion source are dispersed by a dispersion means, and those ions of a predetermined mass number are extracted from the thus-dispersed ions and are selectively implanted into a sample. A plane of incidence of ions in the mass-dispersing means is so formed that the angle of incidence of ions thereon has a negative value, and a plane of emission of ions therein is so formed that the angle of emission of ions of the predetermined mass number therefrom has a positive value.

10 Claims, 4 Drawing Figures

ION IMPLANTER

BACKGROUND OF THE INVENTION (1) Field of the Invention

The present invention relates to an ion implanter, and particularly to an ion implanter which is suited for implanting ions with a heavy current.

(2) Description of the Prior Art

In an ion implanter, ions generated from an ion source are introduced into a magnetic field where they are dispersed according to their mass numbers. Among the ions thus dispersed, those of predetermined mass numbers are allowed to pass through slits selectively, and are implanted into a sample.

In recent years, there has been a strong demand to provide an ion implanter that is capable of implanting ions with a heavy current on the order of 10 milliamperes. To implant ions with a heavy current, it is essential that ions generated from an ion source are able to arrive at the sample with as little loss as possible, i.e., by keeping the ion transmission factor as high as possible.

To increase the ion transmission factor, it is important to utilize the convergence of ions in the dispersion direction thereof (hereinafter referred to as the radial direction) as well as to utilize their convergence in a direction at right angles thereto (hereinafter referred to as the axial direction). A mass-dispersing magnetic field also exhibits a converging function in the radial direction. To converge the ions in the axial direction, on the other hand, a specific device is usually required. That is, a mass-dispersing magnetic field must be formed in the plane of incidence of ions so that the angle of incidence of ions upon that plane of incidence has a positive value. Furthermore, the plane of emission of ions in the mass-dispersing magnetic field must be formed so that the angle of emission of ions of a predetermined mass number which are emitted from the plane of emission has a positive value. This is based upon a prerequisite that ions emitted from the ion source toward a mass-dispersing magnetic field should travel nearly parallel or diverge slightly in the axial direction.

According to studies conducted by the inventors, however, ions emitted from the ion source toward the mass-dispersing magnetic field do not necessarily travel parallel or diverge slightly in the axial direction, but converge slightly as travel, so that the ions converge only poorly on the sample in the axial direction. Furthermore, the convergence of ions varies according to the angle of emission of ions emitted from the ion source in the axial direction (opening angle).

SUMMARY OF THE INVENTION

The object of the present invention is to provide an ion implanter which is suitable for improving the convergence in the axial direction of ions on a sample.

Another object of the present invention is to provide an ion implanter in which the convergence in the axial direction of ions on the sample is not affected much by changes in the angle of emission of ions emitted in the axial direction from the ion source.

According to the present invention, an ion implanter is provided which comprises a means for generating ions, a means for dispersing these ions, and a means for selecting ions of a predetermined mass number from the thus-dispersed ions, so that the selected ions can be implanted into a sample, wherein a plane of incidence of ions onto the dispersion means is so formed that the angle of incidence of the ions on the plane of incidence has a negative value, and a plane of emission of ions from the dispersion means is so formed that the angle of emission of ions of the predetermined mass number which are emitted from the plane of emission has a positive value.

Other objects and features of the present invention will become obvious from the following description taken in conjunction with the drawings.

DESCRIPTION OF THE PREFERRED EMBODIMENT

Figure 1:
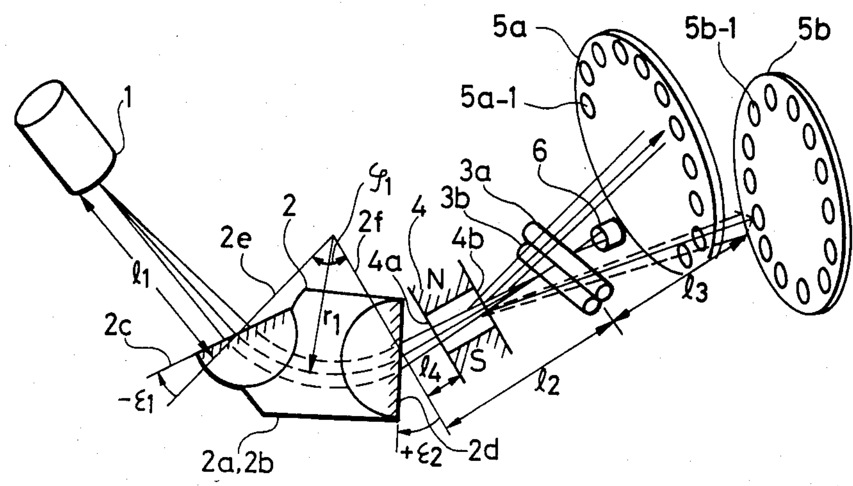
FIG. 1 is a diagram of an ion optical system of an ion implanter according to an embodiment of the present invention.
Figure 2:
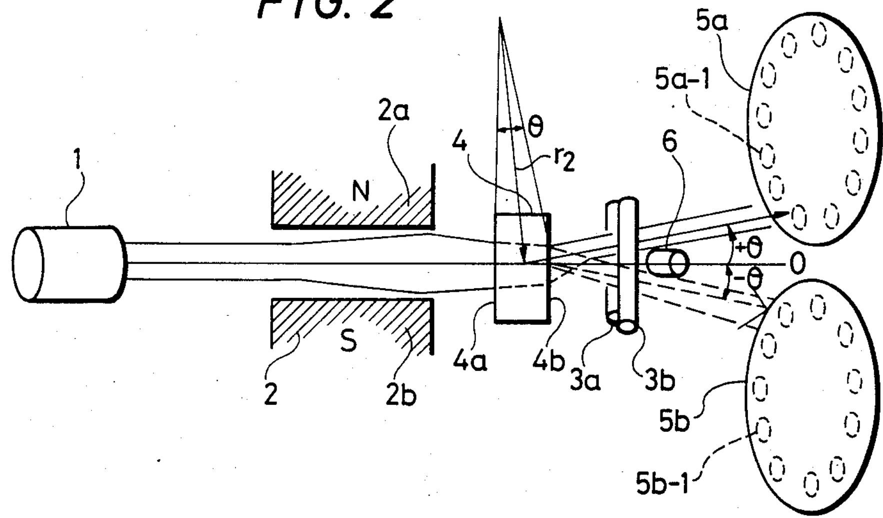
FIG. 2 is a plan view of FIG. 1.

With reference to FIGS. 1 and 2, ions emitted from an ion source 1 are incident in the form of a beam on a magnet 2 that acts as a mass-dispersing means. The magnet 2 consists of a pair of facing magnetic poles *2a* and *2b* between which a magnetic field is established. The ions incident upon the magnet 2 are dispersed within the magnetic field according to their mass numbers. Among the thus-dispersed ions, those of a predetermined mass number are allowed to pass selectively through a slit formed by a pair of slit members *3a* and *3b*.

The pair of magnetic poles *2a* and *2b* are provided with semispherical magnetic pole portions ***2a*-1, *2a*-2, respectively, on the incident side, and magnetic pole portions *2b*-1, *2b*-2 on the emission side. The magnetic pole portions *2a*-1 and *2a*-2 of the incident side have incident end surfaces that agree with a plane of incidence *2c* of ions in the mass-dispersing means. The magnetic pole portions *2b*-1 and *2b*-2 on the emission side have emission end surfaces that agree with a plane of emission *2d* of ions in the mass-dispersing means. The plane of incidence *2c* of ions in the mass-dispersing means is so formed that it defines a negative angle $-\epsilon_1$ with respect to a plane *2e* which is perpendicular to the direction in which the incident ions travel, and the plane of emission *2d* of ions is so formed that it defines a positive angle $+\epsilon_2$ with respect to a plane *2f* which is perpendicular to the direction in which the ions travel, the ions being emitted from the plane of emission *2d*** and having a predetermined mass number.

The fact that the angle subtended between the plane of incidence *2c* and the perpendicular plane *2e* is $-\epsilon_1$, and the angle subtended between the plane of emission *2d* and the perpendicular plane *2f* is $+\epsilon_2$, means that the ions are incident on the plane *2c* of incidence at a negative angle of incidence $-\epsilon_1$, and that the ions of the predetermined mass number emitted from the plane of emission *2d* are emitted at a positive angle of emission $+\epsilon_2$.

The fact that the angle of incidence of the ions has a negative value $-\epsilon_1$ means that the ions incident on the plane of incidence *2c* are diverging in the axial direction, and the fact that the angle of emission of the ions has a positive value $+\epsilon_2$ means that the ions of the predetermined mass number emitted from the plane of emission *2d* are converging in the axial direction.

Between the magnet 2 and the slit, a deflection magnet 4 is provided which selectively deflects the ions of the predetermined mass number emitted from the magnet 2 through by angles of $+\theta$ and $-\theta$ in the axial direction about the axis 0 along which the ions travel. Incidence and emission end surfaces 4*a*, 4*b* of the deflection magnet 4 are parallel to each other, and ions are selectively deflected in either the $+\theta$ direction or the $-\theta$ direction by switching the direction of the magnetic field generated by the deflection magnet 4. This can also be done by employing an electromagnet as the deflection magnet 4 and changing the polarities of an electric current exciting the electromagnet.

The slit formed between the slit members 3*a* and 3*b* has a width aligned in the radial direction, and a length aligned in the axial direction.

A plurality of samples 5*a*-1 and 5*b*-1 are arranged on rotary discs 5*a* and 5*b* at positions such that they intersect the paths of ions of the predetermined mass number which are selectively deflected in the $+\theta$ direction and the $-\theta$ direction by the deflection magnet 4, so that ions are successively implanted into the plurality of samples 5*a*-1 and 5*b*-1.

A detector 6 is arranged in a stage subsequent to the slit to detect neutral particles that are not deflected by the deflection magnet 4 and which travel along the axis 0.

In the ion optical system, in general, if the image width in the radial direction is denoted by $x_2$ and the image in the axial direction by $y_2$, these image widths are given by the following equations, to a first approximation:

$$x_2 = A_x x_1 + A_\alpha \alpha_1 + A_\delta \delta \quad (1)$$

$$y_2 = A_y y_1 + A_\beta \beta_1 \quad (2)$$

where $x_1$ denotes the width of the ion beam at the outlet of the ion source, in the radial direction (i.e., the width of the slit placed at the outlet of the ion source), $\alpha_1$ denotes the angle of spread of the ion beam at the outlet of the ion source in the radial direction, $\delta$ denotes the energy bend width of the ion beam at the outlet of the ion source, $y_1$ denotes the width of the ion beam at the outlet of the ion source in the axial direction (i.e., the length of the slit placed at the outlet of the ion source), and $\beta_1$ denotes the angle of spread of the ion beam at the outlet of the ion source in the axial direction. $A_x$, $A\alpha$ and $A\delta$ denote coefficients of aberration corresponding to the spread of ion beams in the radial direction, and $A_y$ and $A\beta$ denote coefficients of aberration corresponding to the spread of ion beams in the axial direction.

Figure 3:
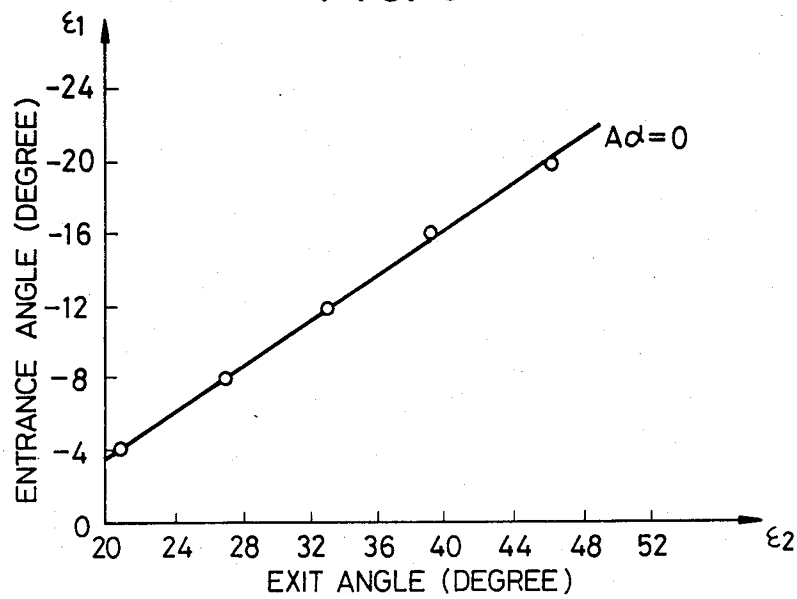
FIG. 3 is a graph of the relationship between the angle of incidence $\epsilon_1$ and the angle of emission $\epsilon_2$ that satisfies the requirement $A\alpha=0$.

From equation (1), it will be obvious that the relationship shown in FIG. 3 must be established between the angle of incidence $\epsilon_1$ and the angle of emission $\epsilon_2$ of ions relative to the magnet 2 that acts as means for dispersing masses, in order to satisfy the condition $A_\chi=0$, i.e., so that ions of a predetermined mass number are converged in the radial direction within the slit formed by the slit members 3*a*, 3*b*.

This result was obtained from the following experimental conditions. The distance from the ion source 1 to the perpendicular plane 2*e* of the magnet 2 was $l_1=0.72$ m, the radius of the central path through the magnet 2 was $r_1=0.47$ m, the angle (i.e., deflection angle) subtended between the perpendicular plane 2*e* and the perpendicular plane 2*f* of the magnet 2 was $\phi_1=75°$, the distance from the perpendicular surface 2*f* to the slit formed by the slit members 3*a*, 3*b* was $l_2=0.79$ m, the distance from the slit to the sample 5*a* was $l_3=0.44$ m, the angle of deflection of ions set by the deflection magnet 4, i.e., the angle of emission of ions, was $\theta-13°$, the radius of the central path through of the deflection magnet 4 was $r_2=0.85$ m, and the distance from the perpendicular surface 2*f* to the deflection magnet 4 was $l_4=0.15$ m.

Figure 4:
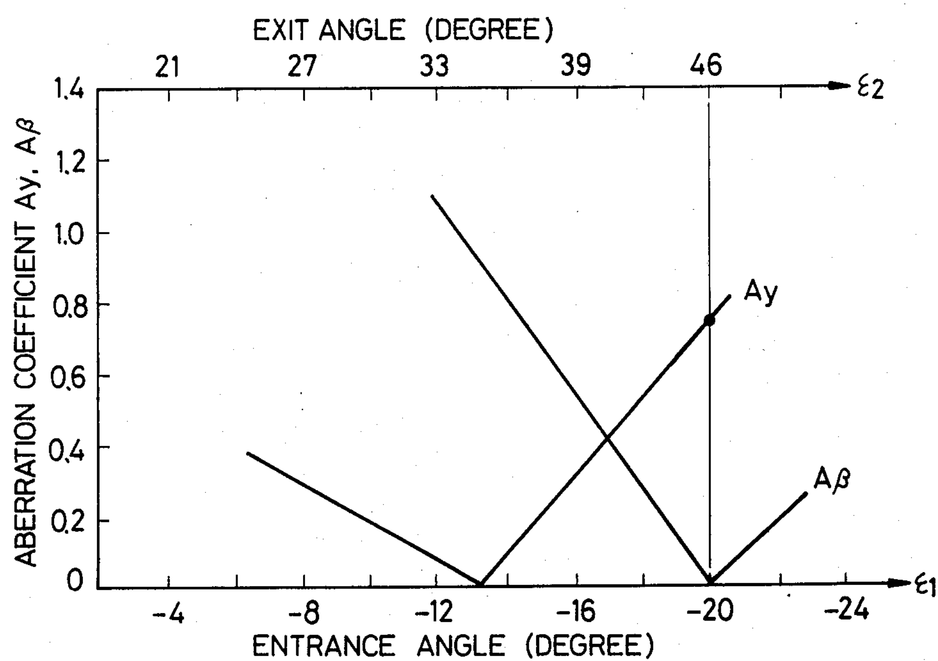
FIG. 4 is a graph of the relationships between $\epsilon_1$, $\epsilon_2$ and $Ay$, $A\beta$.

Under the same conditions, a requirement satisfying $A\beta=0$ was found from equation (2) to minimize $y_2$. The results were as shown in FIG. 4. In FIG. 4, the abscissa denotes the angle of incidence $\epsilon_1$ and the angle of emission $\epsilon_2$, and the ordinate denotes the coefficients of aberration $A_y$, $A\beta$. It will be understood from FIG. 4, that $A\beta=0$ is satisfied when $\epsilon_1$ is $-20°$ and $\epsilon_2$ is $+46°$. In this case, the value of $A_y$ is as small as 0.73. Therefore, if the width of the ion beam at the outlet of the ion source is 40 mm in the axial direction, i.e., if the length of the slit placed at the outlet of the ion source is 40 mm, the following equation holds true, irrespective of the value of $\beta_1$.

$$y_2 = A_y \times y_1 = 0.73 \times 40 \div 29 \text{ mm} \quad (3)$$

This means that ions of the predetermined mass number which are dispersed by the dispersion means are converged maintaining a predetermined width on the samples in the axial direction, irrespective of the value of $\beta_1$.

As will be obvious from FIG. 4, $A\beta$ is not zero when $A_y=0$. In this case, as will be understood from equation (2), $y_2$ and thus the converging condition varies undesirably according to the value of $\beta_1$.

The emission end surface 4 of the deflection magnet 4 is usually formed in a convex shape protruding toward the slit members 3*a*, 3*b* in order to make the ion implantation uniform. If it is formed in a convex shape, however, the ion beam tends to diverge in the axial direction on the sample. However, it has been found that this problem can be solved if the incidence and emission end surfaces 4*a*, 4*b* of the deflection magnet 4 are kept parallel to each other, as shown in FIG. 2.

The embodiment shown in FIGS. 1 and 2 can be modified or changed in various other ways by those skilled in the art, without departing from the gist of the present invention. Therefore it should be noted that the scope of the present invention is in no way limited to the embodiment shown in FIGS. 1 and 2.

What is claimed is:

1. An ion implanter comprising:

a means for generating ions;

a means for dispersing said ions; and a means for selectively extracting ions of a predetermined mass number from the thus-dispersed ions, so that said ions which are extracted can be implanted into a sample;

wherein a plane of incidence of ions in said dispersion means is so formed that the angle of incidence of said ions on said plane of incidence has a negative value, and a plane of emission of ions of said dispersion means is so formed that the angle of emission of ions of said predetermined mass number which are emitted from said plane of emission has a positive value.

2. The ion implanter according to claim 1, wherein a means for deflecting ions in a direction substantially at right angles to the direction in which said ions of said predetermined mass number are dispersed is provided so that the thus-deflected ions are implanted into said sample.

3. The ion implanter according to claim 2, wherein said deflection means consists of a magnet.

4. The ion implanter according to claim 3, wherein said magnet has a plane of incidence of ions and a plane of emission of ions that are parallel to each other.

5. An ion implanter comprising:

a means for generating ions;

a means for dispersing said ions; and a means for selectively extracting ions of a predetermined mass number from the thus-dispersed ions, so that said ions which are extracted can be implanted into a sample;

wherein a plane of incidence of ions in said dispersion means is at a predetermined angle with respect to a plane which crosses substantially at right angles the direction in which ions incident on said plane of incidence travel, so that said ions incident upon said plane of incidence diverge in a direction substantially at right angles to the direction of said dispersion; and a plane of emission of ions in said dispersion means is at a predetermined angle with respect to a plane which crosses substantially at right angles the direction in which ions of said predetermined mass number which are emitted from said plane of emission travel, so that the ions of said predetermined mass number which are emitted from said plane of emission will converge in a direction substantially at right angles to the direction of said dispersion.

6. The ion implanter according to claim 5, wherein a means for deflecting ions in a direction substantially at right angles to the direction in which said ions of said predetermined mass number are dispersed is provided so that the thus-deflected ions are implanted into said sample.

7. The ion implanter according to claim 6, wherein said deflection means consists of a magnet which has a plane of incidence of ions and a plane of emission of ions that are parallel to each other.

8. An ion implanter comprising:

a means for generating ions;

a means for dispersing said ions;

a means for selectively extracting ions of a predetermined mass number from the thus-dispersed ions;

a means for selectively deflecting said thus-dispersed ions of said predetermined mass number in a first angular direction and a second angular direction within a plane substantially at right angles to the direction of said dispersion;

means for arraying first samples in said first angular direction so that ions deflected in said first angular direction are implanted into said first samples; and means for arraying second samples in said second angular direction so that ions deflected in said second angular direction are implanted into said second samples;

wherein a plane of incidence of ions in said dispersion means is at a predetermined angle with respect to a plane which crosses substantially at right angles the direction in which said ions incident on said plane of incidence travel, so that said ions incident upon said plane of incidence will diverge in a direction substantially at right angles to the direction of said dispersion; and a plane of emission of ions in said dispersion means is at a predetermined angle with respect to a plane which crosses substantially at right angles the direction in which ions of said predetermined mass number which are emitted from the plane of emission travel, so that the ions of said predetermined mass number which are emitted from said plane of emission converge in a direction substantially at right angles to the direction of said dispersion.

9. The ion implanter according to claim 8, wherein said deflection means is arranged between said dispersion means and said means for extracting ions.

10. The ion implanter according to claim 9, wherein said deflection means consists of a magnet which has a plane of incidence of ions and a plane of emission of ions that are parallel to each other.

* * * * *